(12) United States Patent
Shim et al.

(10) Patent No.: US 8,957,530 B2
(45) Date of Patent: Feb. 17, 2015

(54) INTEGRATED CIRCUIT PACKAGING SYSTEM WITH EMBEDDED CIRCUITRY AND POST

(75) Inventors: Il Kwon Shim, Singapore (SG); Seng Guan Chow, Singapore (SG); Heap Hoe Kuan, Singapore (SG); Seung Uk Yoon, Singapore (SG); Jong-Woo Ha, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 72 days.

(21) Appl. No.: 13/023,293

(22) Filed: Feb. 8, 2011

(65) Prior Publication Data

US 2011/0127678 A1  Jun. 2, 2011

Related U.S. Application Data

(62) Division of application No. 12/473,233, filed on May 27, 2009, now Pat. No. 7,888,184.

(60) Provisional application No. 61/074,612, filed on Jun. 20, 2008.

(51) Int. Cl.
| | |
|---|---|
| *H01L 23/02* | (2006.01) |
| *H01L 23/48* | (2006.01) |
| *H01L 23/00* | (2006.01) |
| *H01L 21/683* | (2006.01) |
| *H01L 25/065* | (2006.01) |
| *H01L 25/10* | (2006.01) |

(52) U.S. Cl.
CPC ............ *H01L 24/19* (2013.01); *H01L 21/6835* (2013.01); *H01L 24/96* (2013.01); *H01L 24/97* (2013.01); *H01L 25/0657* (2013.01); *H01L 25/105* (2013.01); *H01L 2221/68345* (2013.01); *H01L 2223/6677* (2013.01); *H01L 2224/04105* (2013.01); *H01L 2224/20* (2013.01); *H01L 2224/97* (2013.01); *H01L 2225/06517* (2013.01); *H01L 2225/06527* (2013.01); *H01L 2225/06541* (2013.01); *H01L 2924/01013* (2013.01); *H01L 2924/01027* (2013.01); *H01L 2924/01029* (2013.01); *H01L 2924/01047* (2013.01); *H01L 2924/01078* (2013.01); *H01L 2924/01079* (2013.01); *H01L 2924/01082* (2013.01); *H01L 2924/14* (2013.01); *H01L 2924/15311* (2013.01); *H01L 2924/15331* (2013.01); *H01L 2924/19041* (2013.01); *H01L 2924/19042* (2013.01); *H01L 2924/19043* (2013.01); *H01L 2924/014* (2013.01)
USPC .......................... 257/778; 257/734; 257/686

(58) Field of Classification Search
USPC .......................................... 257/686, 734.778
See application file for complete search history.

(56) References Cited

U.S. PATENT DOCUMENTS

| | | | |
|---|---|---|---|
| 5,726,493 | A | 3/1998 | Yamashita et al. |
| 6,159,767 | A | 12/2000 | Eichelberger |
| 6,309,912 | B1 | 10/2001 | Chiou et al. |
| 6,432,742 | B1 | 8/2002 | Guan et al. |
| 6,489,676 | B2 | 12/2002 | Taniguchi et al. |

(Continued)

*Primary Examiner* — James Mitchell
(74) *Attorney, Agent, or Firm* — Ishimaru & Associates LLP

(57) ABSTRACT

An integrated circuit packaging system includes: an integrated circuit device; a conductive post adjacent the integrated circuit device, the conductive post with a contact surface having characteristics of a shaped platform removed; and an encapsulant around the conductive post and the integrated circuit device with the conductive post extending through the encapsulant and each end of the conductive post exposed from the encapsulant.

10 Claims, 11 Drawing Sheets

(56) References Cited

U.S. PATENT DOCUMENTS

| | | | |
|---|---|---|---|
| 6,495,912 B1 | 12/2002 | Huang et al. | |
| 6,573,598 B2 * | 6/2003 | Ohuchi et al. | 257/734 |
| 6,614,104 B2 | 9/2003 | Farnworth et al. | |
| 6,700,192 B2 | 3/2004 | Matsuzawa et al. | |
| 6,765,299 B2 * | 7/2004 | Takahashi et al. | 257/777 |
| 6,847,109 B2 | 1/2005 | Shim | |
| 6,849,930 B2 | 2/2005 | Nakajima et al. | |
| 6,946,325 B2 | 9/2005 | Yean et al. | |
| 6,987,661 B1 | 1/2006 | Huemoeller et al. | |
| 7,018,866 B2 | 3/2006 | Sugaya et al. | |
| 7,034,386 B2 | 4/2006 | Kurita | |
| 7,084,513 B2 | 8/2006 | Matsuki et al. | |
| 7,185,426 B1 | 3/2007 | Hiner et al. | |
| 7,294,587 B2 | 11/2007 | Asahi et al. | |
| 7,312,405 B2 | 12/2007 | Hsu | |
| 7,334,326 B1 | 2/2008 | Huemoeller et al. | |
| 7,429,786 B2 | 9/2008 | Karnezos et al. | |
| 7,662,672 B2 | 2/2010 | Lin | |
| 7,709,935 B2 | 5/2010 | Islam et al. | |
| 7,723,838 B2 * | 5/2010 | Takeuchi et al. | 257/700 |
| 7,808,095 B2 * | 10/2010 | Jung | 257/686 |
| 7,812,434 B2 * | 10/2010 | Yang | 257/684 |
| 7,851,246 B2 * | 12/2010 | Camacho et al. | 438/51 |
| 7,868,445 B2 * | 1/2011 | Kohl et al. | 257/690 |
| 7,884,484 B2 * | 2/2011 | Yamano et al. | 257/777 |
| 7,943,422 B2 * | 5/2011 | Boon | 438/108 |
| 8,004,089 B2 * | 8/2011 | Jobetto | 257/773 |
| 8,058,102 B2 * | 11/2011 | Lin et al. | 438/109 |
| 8,097,489 B2 * | 1/2012 | Pagaila et al. | 438/106 |
| 8,304,923 B2 * | 11/2012 | Hu et al. | 257/787 |
| 8,829,663 B2 * | 9/2014 | Pohl et al. | 257/685 |
| 2004/0070064 A1 * | 4/2004 | Yamane et al. | 257/686 |
| 2004/0080025 A1 | 4/2004 | Kasahara et al. | |
| 2005/0006737 A1 | 1/2005 | Islam et al. | |
| 2005/0184377 A1 * | 8/2005 | Takeuchi et al. | 257/686 |
| 2007/0045785 A1 | 3/2007 | Noquil | |
| 2007/0222040 A1 | 9/2007 | Lin | |
| 2008/0023805 A1 * | 1/2008 | Howard et al. | 257/666 |
| 2008/0157402 A1 | 7/2008 | Ramakrishna et al. | |
| 2008/0169550 A1 * | 7/2008 | Kurita | 257/686 |
| 2008/0185708 A1 | 8/2008 | Chen et al. | |
| 2008/0272465 A1 * | 11/2008 | Do et al. | 257/620 |
| 2009/0008762 A1 * | 1/2009 | Jung | 257/686 |
| 2009/0008765 A1 * | 1/2009 | Yamano et al. | 257/690 |
| 2009/0008793 A1 * | 1/2009 | Pohl et al. | 257/777 |
| 2009/0091022 A1 * | 4/2009 | Meyer et al. | 257/723 |
| 2009/0140394 A1 * | 6/2009 | Bathan et al. | 257/621 |
| 2009/0146281 A1 * | 6/2009 | Jung | 257/678 |
| 2009/0170241 A1 * | 7/2009 | Shim et al. | 438/107 |
| 2009/0224391 A1 * | 9/2009 | Lin et al. | 257/690 |
| 2009/0224402 A1 * | 9/2009 | Do et al. | 257/738 |
| 2009/0230535 A1 * | 9/2009 | Otremba et al. | 257/690 |
| 2009/0243045 A1 * | 10/2009 | Pagaila et al. | 257/621 |
| 2009/0256247 A1 * | 10/2009 | Landau et al. | 257/676 |
| 2009/0261468 A1 * | 10/2009 | Kroeninger et al. | 257/690 |
| 2009/0302445 A1 * | 12/2009 | Pagaila et al. | 257/678 |
| 2010/0072634 A1 | 3/2010 | Ha et al. | |
| 2010/0244232 A1 | 9/2010 | Pagaila et al. | |
| 2011/0278741 A1 * | 11/2011 | Chua et al. | 257/777 |

* cited by examiner

INTEGRATED CIRCUIT PACKAGING SYSTEM WITH EMBEDDED CIRCUITRY AND POST

CROSS-REFERENCE TO RELATED APPLICATION(S)

This application is a divisional of U.S. patent application Ser. No. 12/473,233 filed May 27, 2009, now U.S. Pat. No. 7,888,184, which claims the benefit of U.S. Provisional Patent Application Ser. No. 61/074,612 filed Jun. 20, 2008, and the subject matter thereof is incorporated herein by reference thereto.

TECHNICAL FIELD

The present invention relates generally to an integrated circuit packaging system, and more particularly to a system for dual sided integrated circuit packaging systems.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages and electrical parts using electrical connections on circuit boards.

Products must compete in world markets and attract many consumers or buyers in order to be successful. It is very important for products to continue to improve in features, performance, and reliability while reducing product costs, product size, and equally important to be available quickly for purchase by the consumers or buyers.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, time to market, reliability, reduction of electrical parts on the circuit boards, size reductions of the circuit boards and the integrated circuit packages, with increased functionality, leveragability, and increased product features to the consumer.

Thus, a need remains for improvements with the integrated circuit packaging system for the world markets. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides an integrated circuit packaging system including: an integrated circuit device; a conductive post adjacent the integrated circuit device, the conductive post with a contact surface having characteristics of a shaped platform removed; and an encapsulant around the conductive post and the integrated circuit device with the conductive post extending through the encapsulant and each end of the conductive post exposed from the encapsulant.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
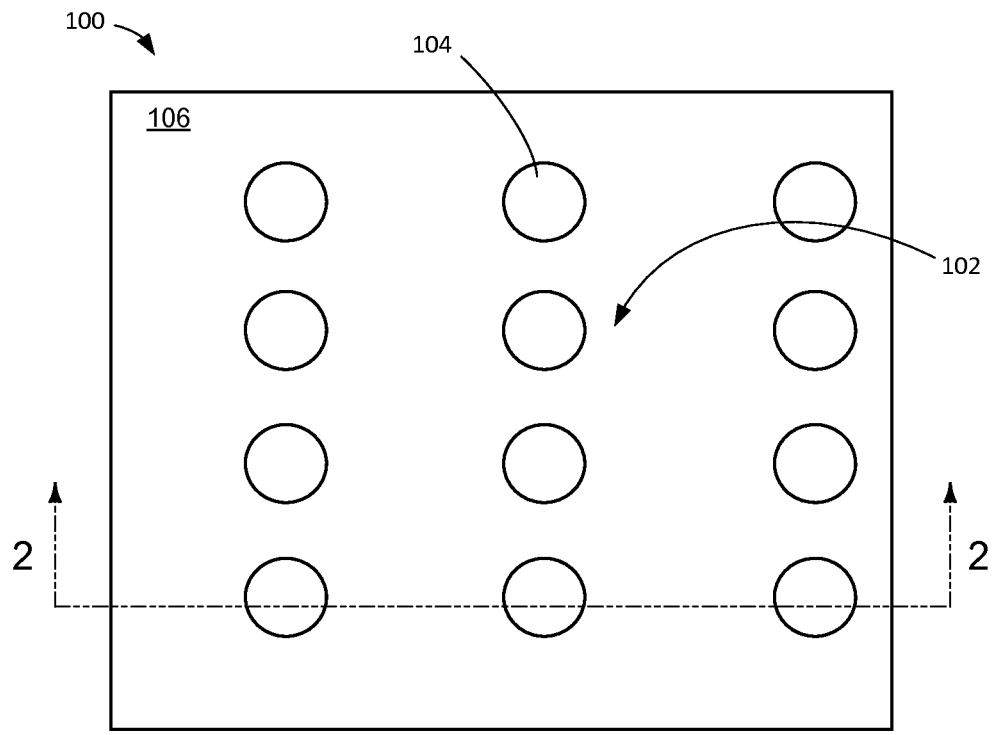
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The top view depicts a top connect structure 102 which can include a non-conductive material and top exposed conductors 104, such as a redistribution layer (RDL), a contact, a trace, a pad, an under bump metallurgy (UBM), a ball, or combination thereof, partially exposed adjacent a top surface 106 of the top connect structure 102.

Solder balls, conductive pillars, or conductors of a component such as an integrated circuit package, a discrete circuit, a discrete semiconductor device, a cable, a connector, an antennae, a circuit board, or any other device having at least one conductor, can optionally be attached to the top exposed conductors 104.

For purposes of illustration, the top exposed conductors 104 of the integrated circuit packaging system 100 are shown as individually having a circular shape and collectively as having a rectangular grid distribution adjacent the top surface 106. It is understood that the top exposed conductors 104 can have any shape or distribution. For example, the top exposed conductors 104 can have a non-circular shape, such as a square, a polygon, an ellipse, or combination thereof, and can collectively be distributed randomly adjacent the top surface 106.

Figure 2:
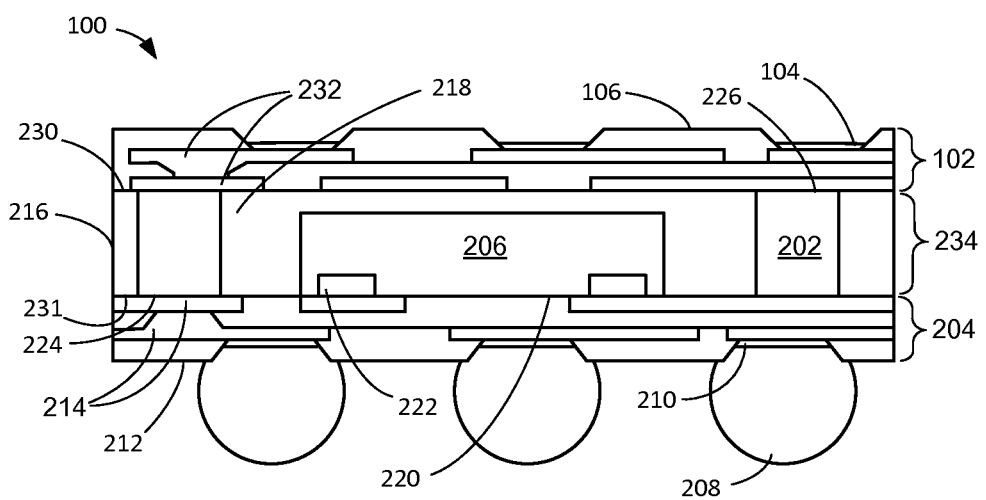
FIG. 2 is a cross-sectional view of the integrated circuit packaging system of the present invention taken along a line 2-2 of FIG. 1.

Referring now to FIG. 2, therein is shown a cross-sectional view of the integrated circuit packaging system 100 of the present invention taken along a line 2-2 of FIG. 1. The integrated circuit packaging system 100 can include the top connect structure 102, conductive posts 202, a bottom connect structure 204, an integrated circuit device 206, and optional external interconnects 208.

The bottom connect structure 204 which can include a non-conductive material and bottom exposed conductors 210, such as a redistribution layer (RDL), a contact, a trace, a pad, an under bump metallurgy (UBM), a ball, or combination thereof, partially exposed adjacent a bottom surface 212 of the bottom connect structure 204.

The bottom connect structure 204 can include bottom conductive elements 214, such as an integrated passive device (IPD) layer, a wire in film (WIF), a redistribution layer (RDL), a trace, a vertical insertion areas (VIA), or combination thereof. The IPD layer can contain passive circuit elements such as capacitors, resistors, or inductors. Each of the bottom conductive elements 214 can have unique physical or geometrical attributes, such as thickness, length, width, or polygonal shapes.

The bottom conductive elements 214 can be electrically connected or coupled to the bottom exposed conductors 210. The bottom surface 212 can be used to structurally support or mount the integrated circuit packaging system 100 on to a bottom component. Package sides 216 of the integrated circuit packaging system 100 can include an edge of the top connect structure 102, an edge of an encapsulant 218, and an edge of the bottom connect structure 204. The bottom conductive elements 214 can be partially exposed adjacent the package sides 216.

An active side 220, with active circuitry fabricated thereon, of the integrated circuit device 206, such as an integrated circuit package, a die, a stacked package, or any combination thereof, can preferably be mounted over a surface opposite the bottom surface 212. Device interconnects 222, such as pads, contacts, bumps, balls, a land grid array (LGA), or leads, of the integrated circuit device 206 adjacent the active side 220 can be used to provide connectivity or coupling between circuitry of the integrated circuit device 206 and the bottom conductive elements 214.

One or more of the conductive posts 202, similar to a vertical insertion areas (VIA) but pre-fabricated from materials such as gold, aluminum, copper, silver, or other high conductive and low resistive materials, can be located laterally adjacent to a perimeter of the integrated circuit device 206. Each of the conductive posts 202 include a base surface 224 on one end and a contact surface 226 on an end opposite the end with the base surface 224. The base surface 224 of the conductive posts 202 can preferably be coplanar with the active side 220 of the integrated circuit device 206 and electrically connected or coupled to the bottom conductive elements 214.

It has been discovered that the present invention provides the integrated circuit packaging system 100 with the capability to produce the conductive posts 202 with specific characteristics. Pre-fabrication of the conductive posts 202 enables selection of metals, such as gold with high electrical conductivity and corrosion resistance, silver with higher electrical and thermal conductivity to gold but lower corrosion resistance, or aluminum (Al) which can be a cost effective metal layer and can be made thicker such as greater than two microns.

It has also been discovered that the present invention provides the integrated circuit packaging system 100 with the capability to produce the conductive posts 202 with improved physical characteristics. The conductive posts 202 can be pre-fabricated with narrow shape having a width smaller than typical vias or contacts such as through organic vias (TOV), through silicon vias (TSV), drilled vias filled with conductors, or etched vias filled with conductors.

The narrow shape or narrow physical profile of the conductive posts 202 with the smaller width can also provide optimal pitched distribution, including placement, of the conductive posts 202. The conductive posts 202 can be formed having smaller spacing than typical vias or contacts for fine pitched distribution, larger spacing with optional wide shapes for course pitched distribution, or any combination of shapes.

Furthermore, it has been discovered that the present invention provides the integrated circuit packaging system 100 with the capability to customize some of the conductive posts 202 for special integrated functions. For example, the conductive posts 202 of different metal materials, can be joined at one end to form a thermocouple device for monitoring the temperature of the integrated circuit packaging system 100.

The contact surface 226 can preferably be coplanar with a plane formed by a side of the integrated circuit device 206 opposite the active side 220 or another plane located above and parallel to the plane. The contact surface 226 can include characteristics of a removal or planarization process such as having been grinded, sanded, sawed, cut, etched, or similar characteristics indicative of a manufacturing separation process phase.

For purposes of illustration, the conductive posts 202 are shown parallel to one another. It is understood that the conductive posts 202 can have any shape provided the base surface 224 is coplanar with the active side 220 and the contact surface 226 can protrude above the integrated circuit device 206. For example, a cross-sectional shape of the conductive posts 202 could be shaped with sides having a conical shape, a hyperbolical shape, a parabolic shape, an elliptical shape, or any shape combination shape thereof. Also for example, the cross-sectional shape of the conductive posts 202 can be of any polygon.

The integrated circuit device 206 and the conductive posts 202 can preferably be encapsulated with the encapsulant 218 to protect the integrated circuit packaging system 100 using materials such as an epoxy, an epoxy blend, a silicone material, a polymide, or similar molding compound. The encapsulant 218 can surround the integrated circuit device 206 and the conductive posts 202. The contact surface 226 can be exposed and coplanar with a top encapsulant surface 230. The encapsulant 218 can include a bottom encapsulant surface 231 on a side of the encapsulant 218 facing opposite of the top encapsulant surface 230. The base surface 224 of the conductive posts 202 can be exposed and coplanar with a side of the encapsulant 218 opposite the top encapsulant surface 230. The active side 220 of the integrated circuit device 206 is coplanar with the bottom encapsulant surface 231.

The top connect structure 102 is shown having the top exposed conductors 104 and top conductive elements 232, such as an integrated passive device (IPD) layer, wire in film (WIF), a redistribution layer (RDL), a trace, a vertical insertion areas (VIA), or any combination thereof. The IPD layer can contain passive circuit elements such as capacitors, resistors, or inductors. Each of the top conductive elements 232 can have unique physical or geometrical attributes, such as thickness, length, width, or polygonal shapes.

The top exposed conductors 104 can be connected to the top conductive elements 232. The top conductive elements 232 can be partially exposed adjacent the package sides 216 of the integrated circuit packaging system 100. The top connect structure 102 with the top conductive elements 232 can be electrically coupled or connected to the contact surface 226 of the conductive posts 202. The bottom connect structure 204 with the bottom conductive elements 214 can be electrically coupled or connected to the base surface 224 of the conductive posts 202.

A stackable assembly 234 can be defined as the integrated circuit device 206 having the device interconnects 222, the conductive posts 202 having the contact surface 226 and the base surface 224, and the encapsulant 218 surrounding the conductive posts 202 and the integrated circuit device 206. The top connect structure 102 or the bottom connect structure 204 can be optionally omitted from the integrated circuit packaging system 100.

The stackable assembly 234 can be stacked over the integrated circuit packaging system 100 having only the bottom connect structure 204 with the base surface 224 of the stackable assembly 234 connected to the contact surface 226 of the integrated circuit packaging system 100.

The integrated circuit packaging system 100 having only the top connect structure 102 can be stacked over the stackable assembly 234 with the base surface 224 of the integrated circuit packaging system 100 connected to the contact surface 226 of the stackable assembly 234.

The stackable assembly 234 can be stacked over another of the stackable assembly 234 with the base surface 224 of the stackable assembly 234 connected to the contact surface 226 of the other of the stackable assembly 234. The contact surface 226 of the stackable assembly 234 could be connected to conductors of a component such as an integrated circuit package, a discrete circuit, a discrete semiconductor device, a cable, a connector, an antenna, a circuit board, or any other device having at least one conductor without the top connect structure 102.

The integrated circuit packaging system 100 can be stacked over or under a stack package such as another of the integrated circuit packaging system 100 or other component having connectivity attributes compatible with the integrated circuit packaging system 100. The top surface 106 can be used to structurally support or mount a top component such as an integrated circuit package, a stacked package, a discrete circuit, a discrete semiconductor device, a connector, a heat sink, an antenna, or a circuit board.

Figure 3:
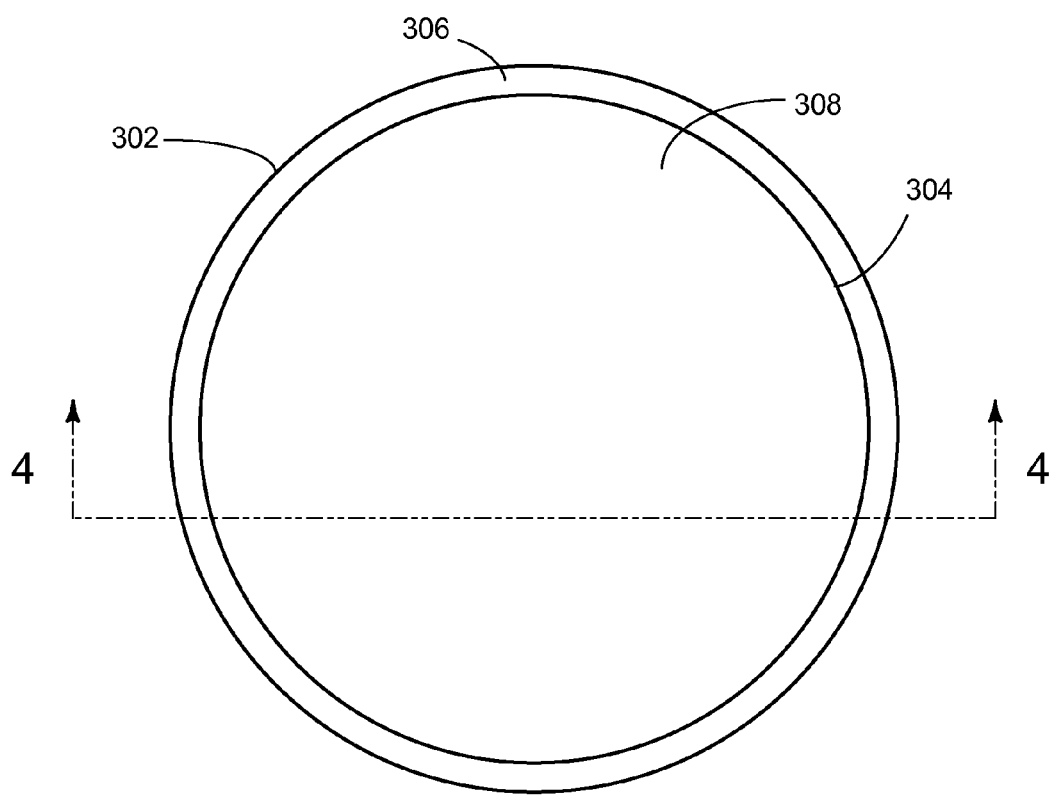
FIG. 3 is a top view of a temporary carrier in a layering phase of manufacture of the integrated circuit packaging system of FIG. 2.

Referring now to FIG. 3, therein is shown a top view of a temporary carrier 302 in a layering phase of manufacture of the integrated circuit packaging system 100 of FIG. 2. The temporary carrier 302, such as a flat silicon or tape platform having user specified durability, hardness, chemical, and scratch characteristics. An adhesive layer 304 can preferably be coated on a mount side 306 of the temporary carrier 302. The adhesive layer 304 having a top adhesive surface 308 can provide a mounting surface.

For purposes of illustration, the temporary carrier 302 is shown to have a circular shape. It is understood that the temporary carrier 302 can have any shape. For example, the temporary carrier 302 can have a polygon shape.

Figure 4:
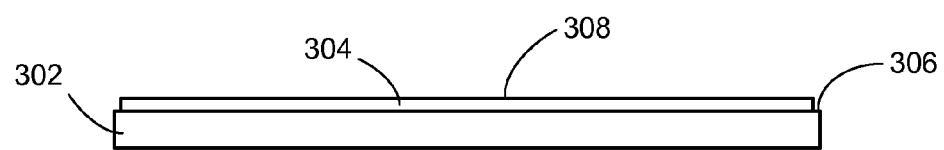
FIG. 4 is a cross-sectional view of FIG. 3 taken along a line 4-4 of FIG. 3.

Referring now to FIG. 4, therein is shown a cross-sectional view of FIG. 3 taken along a line 4-4 of FIG. 3. The adhesive layer 304 is shown attached to the mount side 306 of the temporary carrier 302. The top adhesive surface 308 of the adhesive layer 304 can preferably be coplanar with a side of the temporary carrier 302 opposite the mount side 306.

Figure 5:
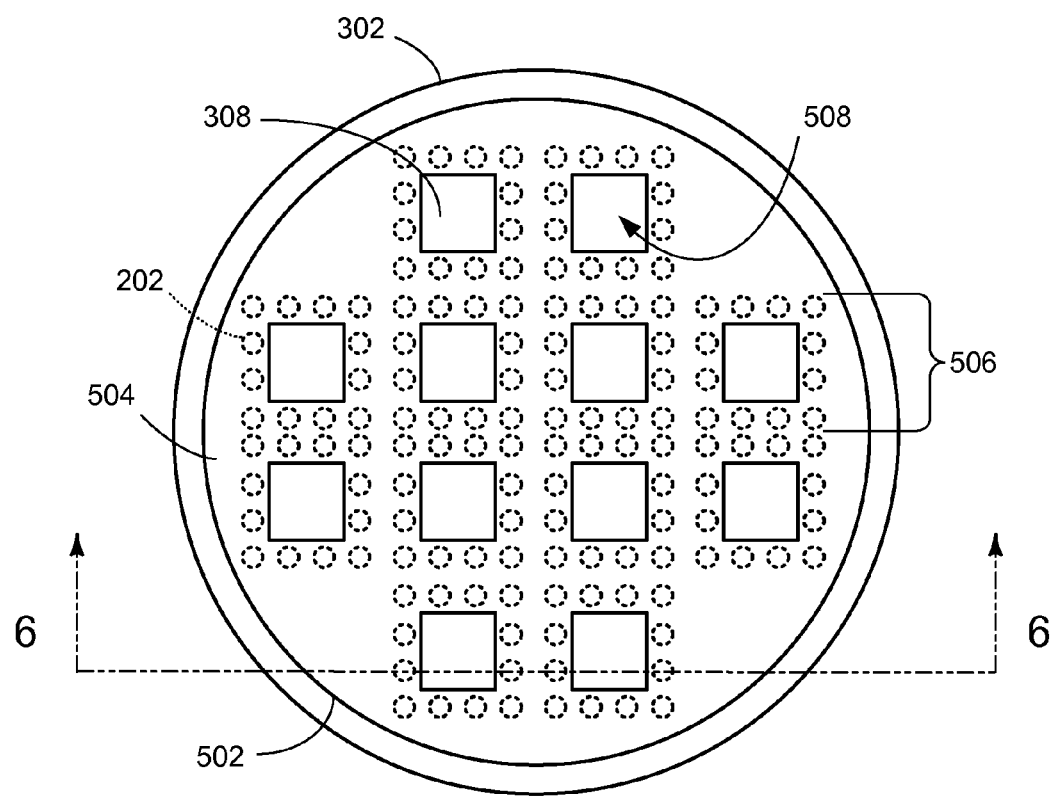
FIG. 5 is the structure of FIG. 3 in a mounting phase of a shaped platform coupled with the conductive posts.

Referring now to FIG. 5, therein is shown the structure of FIG. 3 in a mounting phase of a shaped platform 502 coupled with the conductive posts 202. The shaped platform 502 can be located over the temporary carrier 302. The shaped platform 502 includes a back side 504 facing away from the temporary carrier 302 and an opposite side with coupled with an end of the conductive posts 202. The base surface 224 of the conductive posts 202, opposite the end coupled with the shaped platform 502, can be attached to the top adhesive surface 308 on the temporary carrier 302.

For purposes of illustration, the shaped platform 502 is shown having a circular shape. It is understood that the shaped platform 502 can have any shape. For example, the shaped platform 502 can have a polygon shape.

The shaped platform 502 can be formed from the same material as the conductive posts 202 or from other materials capable of structurally supporting an end of the conductive posts 202 during the manufacturing processes. The shaped platform 502 and the conductive posts can be pre-formed together as an integral structure or can be pre-formed separately and connected together as a single structure.

It has been discovered that having the shaped platform 502 and the conductive posts 202 as an integral a single structure, mounted to the top adhesive surface 308 on the temporary carrier 302, provides rigid structural support of each end of the conductive posts 202. The improved structural support of each end of the conductive posts 202 enables precise placement of the conductive posts 202 and enables the conductive posts 202 to have narrow physical profile characteristics resulting in a substantial increase in package connectivity and fine pitch placement capabilities.

An access through region 508, formed using a process such as sawing, etching, cutting, or similar removal process, can provide an unobstructed access path to the top adhesive surface 308 from above the back side 504 of the shaped platform 502.

The shaped platform 502 can preferably include one or more build sites 506. Each of the build sites 506 define a physical location relative to the shaped platform 502 and the conductive posts 202 that can be used to build and manufacture the integrated circuit packaging system 100 of FIG. 2. The build sites 506 of the shaped platform 502 include the access through region 508, such as an unrestricted opening or hole extending through the shaped platform 502, from the back side 504 to an opposite side of the shaped platform 502 facing the temporary carrier 302.

Furthermore, for purposes of illustration, the shaped platform 502 is shown with the access through region 508 having a square shape. It is understood that the access through region 508 can be formed to have any shape. For example, the opening of the access through region 508 can have a round shape, a polygon shape, an elliptical shape, or any combination thereof.

Furthermore, for purposes of illustration, a single row of the conductive posts 202 is shown around a perimeter of the access through region 508. It is understood that the number of rows or distribution of the conductive posts 202 located around the access through region 508 is non-limiting. For example, several rows of the conductive posts 202 can be formed around the perimeter of the access through region 508 or each of the conductive posts 202 can be distributed randomly around the perimeter.

It has been discovered that the present invention provides the integrated circuit packaging system 100 with continuous manufacturing flow (CFM) compatibilities. Multiple personalized versions of the shaped platform 502, having different quantity and placement configurations of the conductive posts 202, can be pre-fabricated. Supply and demands for different versions of the integrated circuit packaging system 100 can be immediately produced to satisfy market needs without interruptions to the manufacturing assembly flow.

Figure 6:
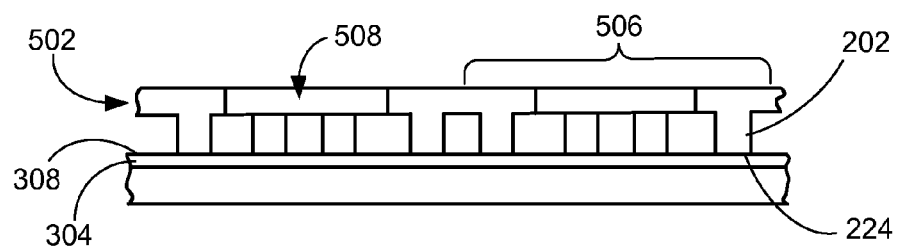
FIG. 6 is a cross-sectional view of FIG. 5 taken along a line 6-6 of FIG. 5.

Referring now to FIG. 6, therein is shown a cross-sectional view of FIG. 5 taken along a line 6-6 of FIG. 5. The shaped platform 502 with the access through region 508 and the conductive posts 202 are shown mounted over the adhesive layer 304 by attaching the base surface 224 of the conductive posts 202 to the top adhesive surface 308 of the adhesive layer 304. The shaped platform 502 with the access through region 508 and the conductive posts 202 can preferably be pre-fabricated before the attachment to the adhesive layer 304.

For purposes of illustration, a horizontal center of the access through region 508 is located on a vertical line perpendicular to the top adhesive surface 308 and located centrally within each of the build sites 506. It is understood that the horizontal center of the access through region 508 can have a horizontal offset away from the vertical line. For example, the horizontal center of the access through region 508 can be offset horizontally to the left of the vertical line and with the access through region 508 remaining within each of the build sites 506.

Furthermore, for purposes of illustration, all of the conductive posts 202 within each of the build sites 506 span an area having a horizontal point located centrally within the area. The horizontal point is located on the vertical line. It is understood that the horizontal point can have a second horizontal offset away from the vertical line. For example, the horizontal point can be offset horizontally to the right of the vertical line.

Figure 7:
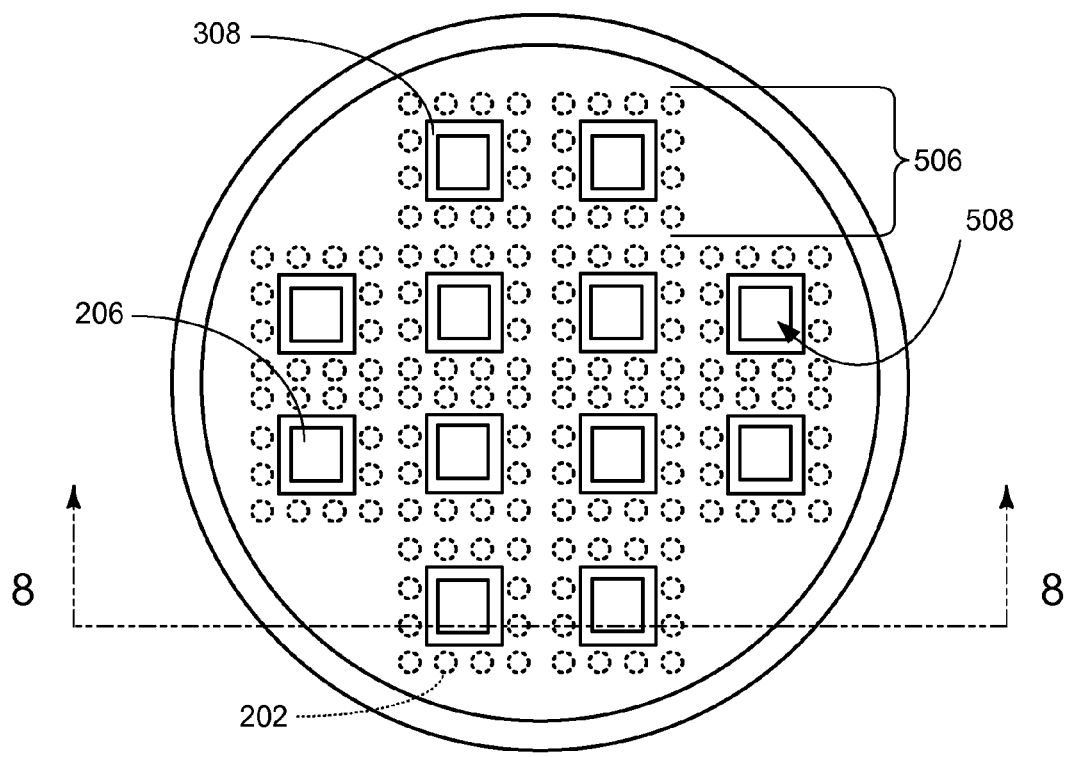
FIG. 7 is the structure of FIG. 5 in an attaching phase of the integrated circuit device.

Referring now to FIG. 7, therein is shown the structure of FIG. 5 in an attaching phase of the integrated circuit device 206. The build sites 506 are shown having the integrated circuit device 206 mounted below the access through region 508 over the top adhesive surface 308. The conductive posts 202 within each of the build sites 506 surround the integrated circuit device 206.

The integrated circuit device 206 can preferably have length and width dimensions smaller than length and width dimensions of the access through region 508, enabling the integrated circuit device 206 to be inserted through the access through region 508.

Figure 8:
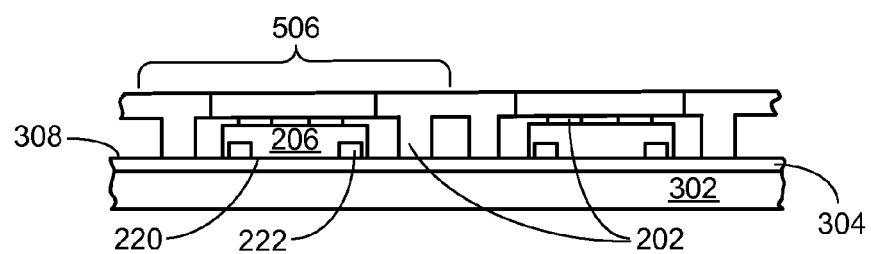
FIG. 8 is a cross-sectional view of FIG. 7 taken along a line 8-8 of FIG. 7.

Referring now to FIG. 8, therein is shown a cross-sectional view of FIG. 7 taken along a line 8-8 of FIG. 7. The active side 220 of the integrated circuit device 206 having the device interconnects 222 is attached over and facing the top adhesive surface 308 of the adhesive layer 304 on the temporary carrier 302. The dimensional height of the integrated circuit device 206 can preferably be less than the dimensional height of the conductive posts 202.

For purposes of illustration, the integrated circuit device 206 is shown horizontally centered between the conductive posts 202 intersected by the line 8-8 of FIG. 7. It is understood that the integrated circuit device 206, within the build sites 506, can be off centered with respect to the conductive posts 202 intersected by the line 8-8. For example, the integrated circuit device 206 can have an offset towards a line perpendicular to a point located at the center of the top adhesive surface 308.

Figure 9:
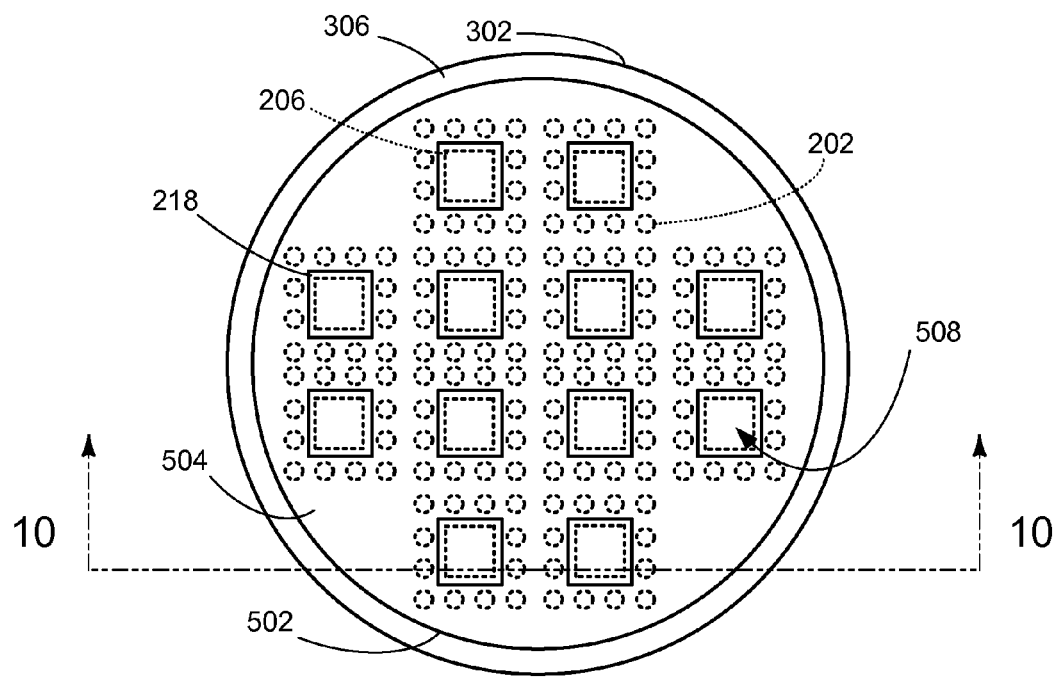
FIG. 9 is the structure of FIG. 7 in an encapsulating phase.

Referring now to FIG. 9, therein is shown the structure of FIG. 7 in an encapsulating phase. The integrated circuit device 206 and the conductive posts 202 are encapsulated with the encapsulant 218. The access through region 508 is filled with the encapsulant 218 and the conductive posts 202 surrounded with the encapsulant 218. The encapsulant 218 can optionally partially or completely cover the back side 504 of the shaped platform 502. The encapsulant 218 can optionally partially or fully cover the mount side 306 of the temporary carrier 302.

Figure 10:
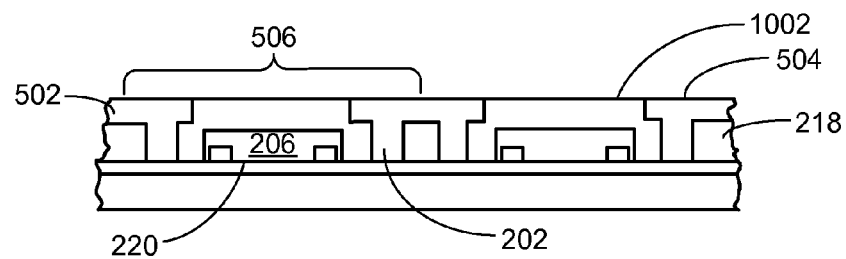
FIG. 10 is a cross-sectional view of FIG. 9 taken along a line 10-10 of FIG. 9.

Referring now to FIG. 10, therein is shown a cross-sectional view of FIG. 9 taken along a line 10-10 of FIG. 9. The build sites 506 are shown with the integrated circuit device 206 covered with the encapsulant 218. The conductive posts 202 are surrounded with the encapsulant 218.

For purposes of illustration, the encapsulant 218 is shown having a top encapsulant side 1002 coplanar with the back side 504 of the shaped platform 502. It is understood that the top encapsulant side 1002 can be below a plane formed from the back side 504. For example, as a result of the encapsulation process, the top encapsulant side 1002 can be anywhere between the side of the integrated circuit device 206 opposite the active side 220 and below the plane formed from the back side 504.

It has been discovered that the present invention provides the integrated circuit packaging system 100 of FIG. 2 with reduced manufacturing costs and process steps. Pre-fabrication of the conductive posts 202, positioned and encapsulated in place, reduces costs and process steps by eliminating steps such as drilling holes, three dimensional alignment hole processes, conductive material reflow.

Figure 11:
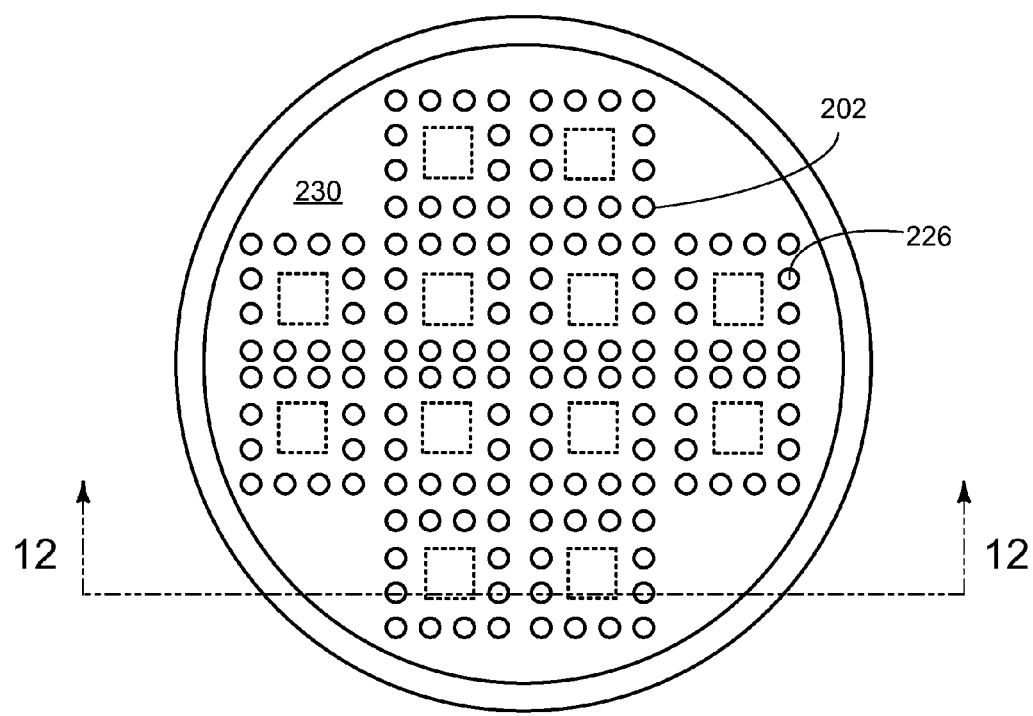
FIG. 11 is the structure of FIG. 9 in a removing phase.

Referring now to FIG. 11, therein is shown the structure of FIG. 9 in a removing phase. Any of the encapsulant 218 of FIG. 9 above the shaped platform 502 of FIG. 9 and a portion of the shaped platform 502 can be removed using a removal or planarizing process such as grinding, sanding, etching, sawing, cutting, or combination thereof. The top encapsulant side 1002 of FIG. 10 and an end of each of the conductive posts 202 opposite the base surface 224 of FIG. 6 can be fully exposed and isolated.

The top encapsulant side 1002 and the end of each of the conductive posts 202 are removed or planarized using a process such as grinding, sanding, etching, or combination thereof. The process can be used to form the contact surface 226 on the end of the conductive posts 202. The contact surface 226 can be coplanar with the top encapsulant surface 230.

Figure 12:
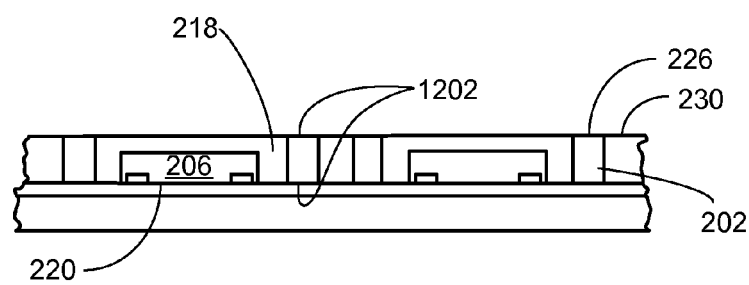
FIG. 12 is a cross-sectional view of FIG. 11 taken along a line 12-12 of FIG. 11.

Referring now to FIG. 12, therein is shown a cross-sectional view of FIG. 11 taken along a line 12-12 of FIG. 11. The contact surface 226 of each of the conductive posts 202 and the top encapsulant surface 230 are coplanar. The conductive posts 202 are further shown extending through the encapsulant 218 with each end 1202 of the conductive posts 202 exposed from the encapsulant 218.

For purposes of illustration, a plane containing the top encapsulant surface 230 and the contact surface 226 is located above the integrated circuit device 206. It is understood that the top encapsulant surface 230, the contact surface 226, and the side of the integrated circuit device 206 opposite the active side 220 can be coplanar. For example, the removing or planarizing process can be used to lower the contact surface 226 and the top encapsulant surface 230 down to the side of the integrated circuit device 206 opposite the active side 220.

It has been found that all steps leading to and including the removing and planarizing phase can be accomplished with present wafer-level manufacturing methods and equipment. The present invention provides a fast and efficient solution without the need to allocate time for new tooling or process steps.

Figure 13:
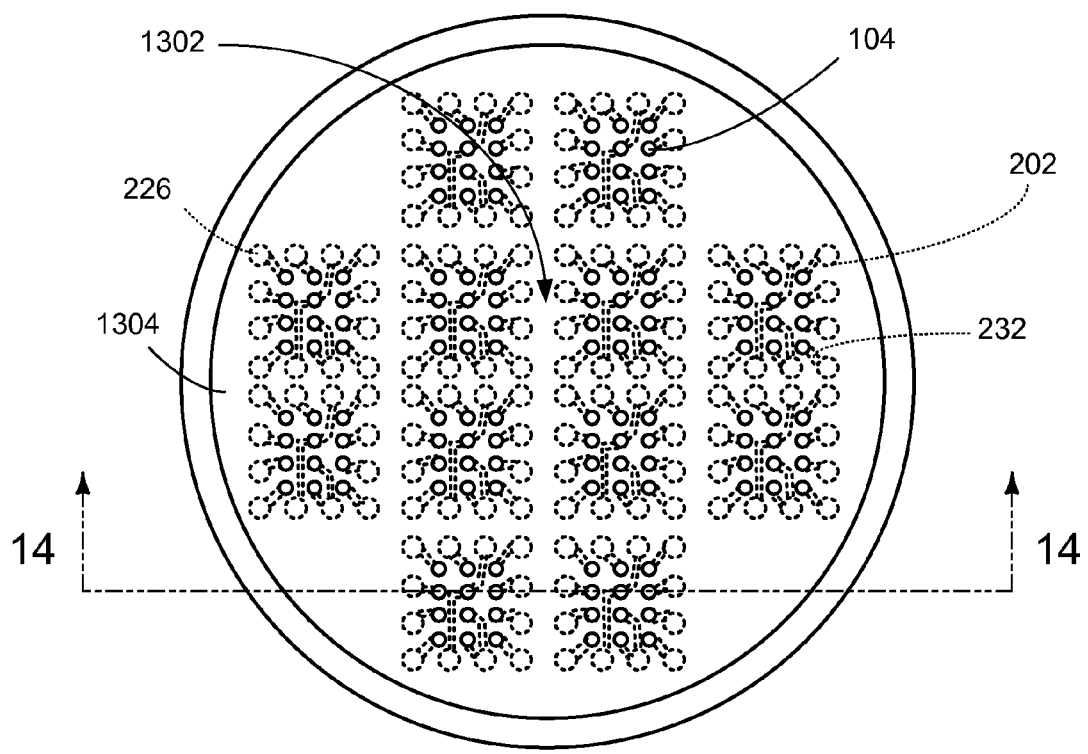
FIG. 13 is the structure of FIG. 11 in an upper forming phase of a top assembly.

Referring now to FIG. 13, therein is shown the structure of FIG. 11 in an upper forming phase of a top assembly 1302. The top assembly 1302 can be formed over the contact surface 226 of the conductive posts 202 and the top encapsulant surface 230 of FIG. 11 using a film layer forming process such as plating and etching, lamination, screen printing, film deposition, or combinations thereof. The top assembly 1302, formed having a non-conductive material, the top conductive elements 232, and the top exposed conductors 104 partially exposed adjacent a top assembly surface 1304.

The top conductive elements 232 can be formed in one or more layers of the top assembly 1302, each capable of coupling or connecting to another of the top conductive elements 232, to the top exposed conductors 104, or to the contact surface 226 of the conductive posts 202. The top conductive elements 232 are directly on the conductive posts 202 and are coplanar with the top encapsulant surface 230 of FIG. 2 for forming a redistribution layer (RDL) along a horizontal plane.

Figure 14:
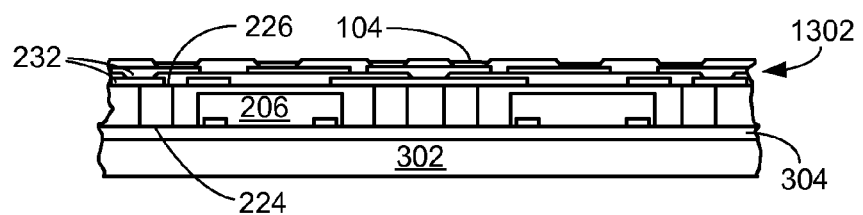
FIG. 14 is a cross-sectional view of FIG. 13 taken along a line 14-14 of FIG. 13.

Referring now to FIG. 14, therein is shown a cross-sectional view of FIG. 13 taken along a line 14-14 of FIG. 13. The top assembly 1302 with the top exposed conductors 104 and the top conductive elements 232 are shown over the integrated circuit device 206. The contact surface 226 can be coupled or connected to the top conductive elements 232. The base surface 224 can be attached to the adhesive layer 304 on the temporary carrier 302.

Figure 15:
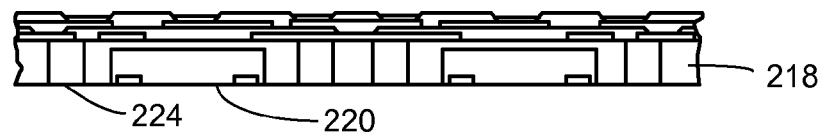
FIG. 15 is the structure of FIG. 14 in a removing phase of the temporary carrier.

Referring now to FIG. 15, therein is shown the structure of FIG. 14 in a removing phase of the temporary carrier 302 of FIG. 14. The temporary carrier 302 and the adhesive layer 304 of FIG. 14 are separated from the active side 220, the base surface 224, and the encapsulant 218 using a debonding process such as a wedge or slide lift-off procedure with applied heat or chemical, or another procedure appropriate for the technology of the adhesive layer 304.

The base surface 224 can have characteristics of removing an adhesive such as a substantially smooth surface without processing or tooling marks or a portion of the adhesive layer 304 remaining on the base surface 224. The portion of the adhesive layer 304 can preferably be predetermined to provide the substantially smooth surface with optimal electrical or mechanical connectivity.

Figure 16:
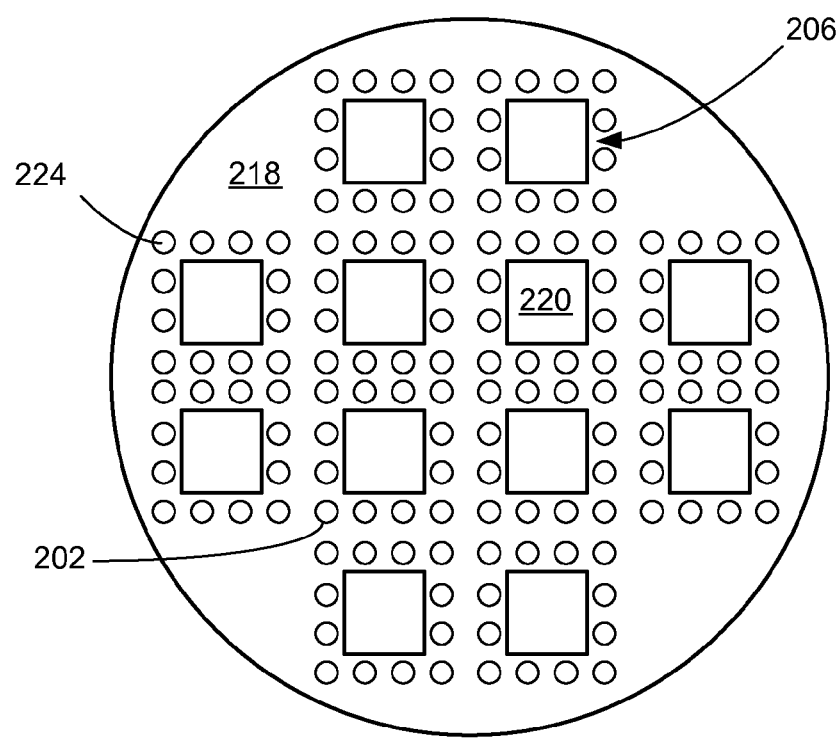
FIG. 16 is a bottom view of the structure of FIG. 15.

Referring now to FIG. 16, therein is shown a bottom view of the structure of FIG. 15. The encapsulant 218 is shown with the base surface 224 of the conductive posts 202 and the active side 220 of the integrated circuit device 206 exposed.

For purposes of illustration, the device interconnects 222 of FIG. 2 are not shown. It is understood that the device interconnects 222 are exposed. For example, the device interconnects 222 can be exposed adjacent the active side 220.

Figure 17:
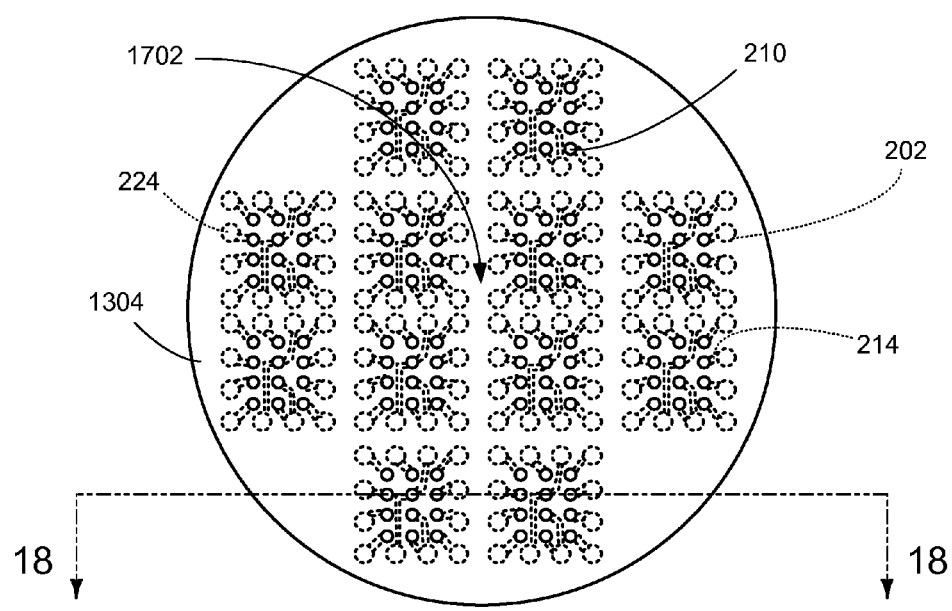
FIG. 17 is the structure of FIG. 16 in a lower forming phase of a bottom assembly.

Referring now to FIG. 17, therein is shown is the structure of FIG. 16 in a lower forming phase of a bottom assembly 1702. The bottom assembly 1702 can be formed over the base surface 224 of the conductive posts 202 and the encapsulant 218 of FIG. 16 surrounding the base surface 224. The bottom assembly 1702 can be formed using a film layer forming process such as plating and etching, lamination, screen printing, film deposition, or combinations thereof.

The bottom assembly 1702, formed having a non-conductive material, the bottom conductive elements 214, and the bottom exposed conductors 210 partially exposed adjacent the top assembly surface 1304. The bottom conductive elements 214 can be formed in layers, each capable of connecting to one another, to the bottom exposed conductors 210, to the base surface 224 of the conductive posts 202, or to the device interconnects 222 of FIG. 2.

Figure 18:
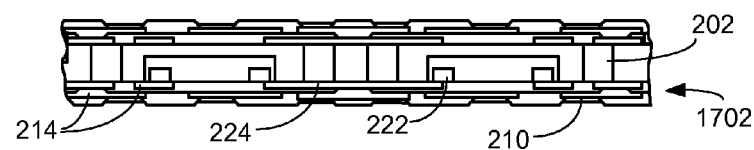
FIG. 18 is a cross-sectional view of FIG. 17 taken along a line 18-18 of FIG. 17.

Referring now to FIG. 18, therein is shown a cross-sectional view of FIG. 17 taken along a line 18-18 of FIG. 17. The bottom assembly 1702 is shown with the bottom exposed conductors 210 and the bottom conductive elements 214. The bottom conductive elements 214 are shown connecting or coupling to the bottom exposed conductors 210, the device interconnects 222, the base surface 224 of the conductive posts 202, or another of the bottom conductive elements 214.

Figure 19:
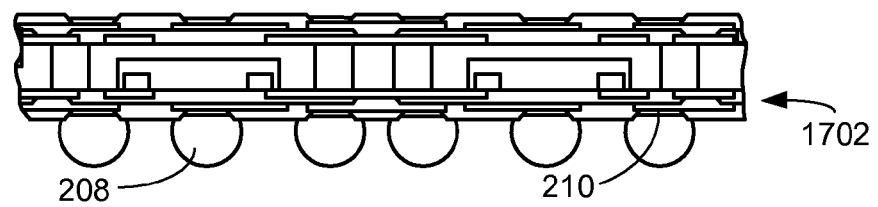
FIG. 19 is the structure of FIG. 18 in an attaching phase of the optional external interconnects.

Referring now to FIG. 19, therein is shown the structure of FIG. 18 in an attaching phase of the optional external interconnects 208. The optional external interconnects 208 can be attached to the bottom exposed conductors 210 of the bottom assembly 1702 using an attachment process such as a solder reflow process with convection heating or laser energy.

Figure 20:
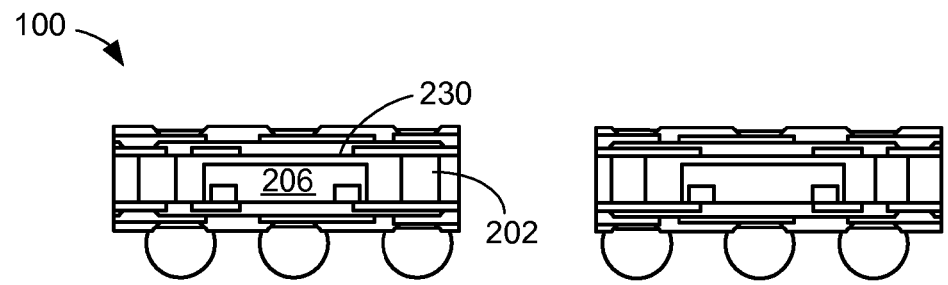
FIG. 20 is the structure of FIG. 19 in a singulation phase.

Referring now to FIG. 20, therein is shown the structure of FIG. 19 in a singulation phase. A singulation process such as cutting, sawing, grinding, or combinations thereof, is used to separate the integrated circuit device 206 and the conductive posts 202 surrounding a perimeter of the integrated circuit device 206 from one another along vertical planes formed perpendicular to the top encapsulant surface 230. The singulation process results in forming several integrated circuit packaging systems such as the integrated circuit packaging system 100 of FIG. 2.

Figure 21:
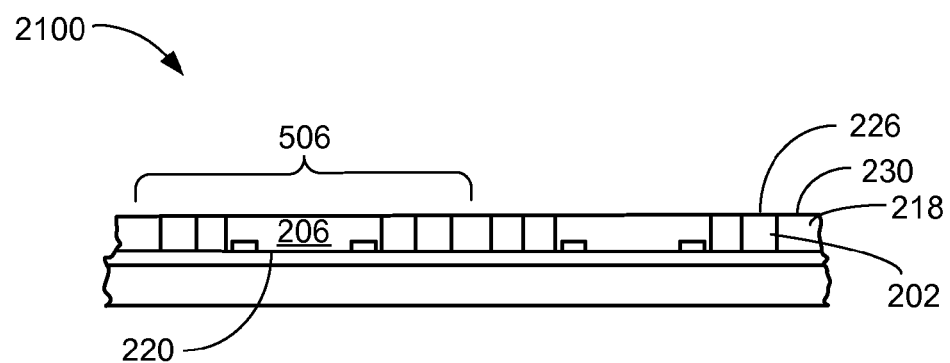
FIG. 21 is the structure of FIG. 12 in a removing phase of manufacture of an integrated circuit packaging system in a second embodiment of the present invention.

Referring now to FIG. 21, therein is shown the structure of FIG. 12 in a removing phase of manufacture of an integrated circuit packaging system 2100 in a second embodiment of the present invention. The top encapsulant side 1002 of FIG. 10 and the end of each of the conductive posts 202 within the build sites 506 are removed or planarized using a process such as grinding, sanding, etching, or combination thereof. The side of the integrated circuit device 206 opposite the active side 220 can be exposed and coplanar with the contact surface 226 of each of the conductive posts 202 and the top encapsulant surface 230.

The removing or planarizing phase of manufacture of the integrated circuit packaging system 2100 can result in a height lower than the height of the integrated circuit packaging system 100 of FIG. 2.

Figure 22:
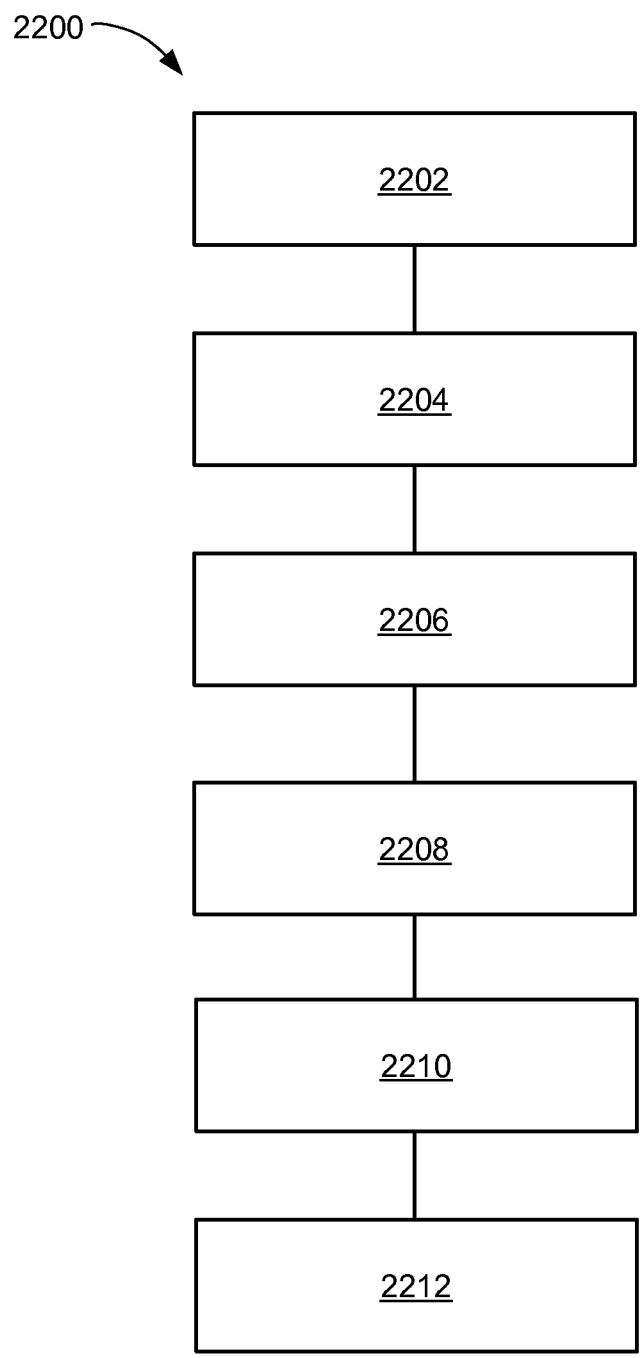
FIG. 22 is a flow chart of a method of manufacture of an integrated circuit packaging system in a further embodiment of the present invention.

Referring now to FIG. 22, therein is shown a flow chart of a method 2200 of manufacture of an integrated circuit packaging system 100 in a further embodiment of the present invention. The method 2200 includes providing a shaped platform with a conductive post in a block 2202; mounting the shaped platform with the conductive post over a temporary carrier in a block 2204; mounting an integrated circuit device over the temporary carrier in a block 2206; encapsulating the conductive post and the integrated circuit device in a block 2208; removing a portion of the shaped platform isolating the conductive post in a block 2210; and removing the temporary carrier in a block 2212.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package on package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    an integrated circuit device, the integrated circuit device includes device interconnects;
    a conductive post laterally adjacent to the integrated circuit device, the conductive post with a contact surface;
    an encapsulant around the conductive post and the integrated circuit device with the conductive post extending through the encapsulant and each end of the conductive post exposed from the encapsulant, an active side of the integrated circuit device coplanar with a bottom encapsulant surface of the encapsulant;
    a top conductive layer in direct physical contact with the contact surface and the encapsulant, such that the conductive layer is coplanar to the encapsulant for forming a redistribution layer along a horizontal plane; and
    a bottom conductive layer in direct contact with a base surface of the conductive post, in direct physical contact with the device interconnects of the integrated circuit device, in direct physical contact with the active surface of the integrated circuit device, and in direct physical contact with a bottom encapsulant surface of the encapsulant.

2. The system as claimed in claim 1 wherein the bottom conductive layer is electrically coupled to the conductive post.

3. The system as claimed in claim 1 wherein the conductive post includes the conductive post having a narrow physical profile.

4. The system as claimed in claim 1 wherein the conductive post includes the conductive post with the base surface coplanar with the active surface of the integrated circuit device.

5. The system as claimed in claim 1 wherein the conductive post includes the conductive post coplanar with a side of the encapsulant opposite to the top encapsulant surface.

6. The system as claimed in claim 1 wherein the integrated circuit device with the active surface mounted adjacent the conductive post.

7. The system as claimed in claim 6 further comprising a top exposed conductor on the top layer.

8. The system as claimed in claim 6 wherein the conductive post includes gold, aluminum, copper, or silver.

9. The system as claimed in claim 6 wherein the conductive post includes the conductive post with a thickness greater than two microns.

10. The system as claimed in claim 6 wherein the conductive post with the contact surface includes the contact surface coplanar with a top encapsulant surface.

* * * * *